(12) United States Patent
Jahn et al.

(10) Patent No.: US 9,917,533 B2
(45) Date of Patent: Mar. 13, 2018

(54) DRIVER ASSEMBLY

(71) Applicant: Lemförder Electronic GmbH, Espelkamp (DE)

(72) Inventors: Jorg Jahn, Bünde (DE); Thomas Erdmann, Stemwede (DE); Ajoy Palit, Bremen (DE)

(73) Assignee: Lemförder Electronic GmbH, Espelkamp (DE)

( * ) Notice: Subject to any disclaimer, the term of this patent is extended or adjusted under 35 U.S.C. 154(b) by 0 days.

(21) Appl. No.: 15/129,447

(22) PCT Filed: Feb. 19, 2015

(86) PCT No.: PCT/EP2015/053467
§ 371 (c)(1),
(2) Date: Sep. 27, 2016

(87) PCT Pub. No.: WO2015/149987
PCT Pub. Date: Oct. 8, 2015

(65) Prior Publication Data
US 2017/0110984 A1    Apr. 20, 2017

(30) Foreign Application Priority Data

Mar. 31, 2014  (DE) .................... 10 2014 205 956

(51) Int. Cl.
*H02M 7/537* (2006.01)
*H02K 11/33* (2016.01)
*H02K 9/02* (2006.01)
*H02P 27/06* (2006.01)
(Continued)

(52) U.S. Cl.
CPC .............. *H02M 7/537* (2013.01); *H02K 9/02* (2013.01); *H02K 11/33* (2016.01); *H02M 7/003* (2013.01); *H02P 27/06* (2013.01); *H05K 7/209* (2013.01)

(58) Field of Classification Search
CPC .. H02M 7/537; H02M 7/003; H02K 2213/03; H02K 5/24; H02K 9/005; H02K 11/33; H02K 9/02; H02P 27/06; H05K 7/209
See application file for complete search history.

(56) References Cited

U.S. PATENT DOCUMENTS 5,444,295 A * 8/1995 Lake ....................... H01L 23/66
                                                              257/678
9,425,673 B2 * 8/2016 Miyama ................... H02K 5/24
(Continued)

FOREIGN PATENT DOCUMENTS

EP    0 697 759 A1    2/1996
EP    1 993 192 A1    11/2008

OTHER PUBLICATIONS

International Search Report dated May 27, 2015 in International Application No. PCT/EP2015/053467, 5 pages, German Language.
(Continued)

*Primary Examiner* — Fred E Finch, III
*Assistant Examiner* — Demetries A Gibson
(74) *Attorney, Agent, or Firm* — Brinks Gilson & Lione

(57) ABSTRACT

A driver assembly comprises several semiconductor switches that are arranged in a plane so that distances between adjacent semiconductor switches in the plane are equally large, and so that each semiconductor switch has the same number of adjacent semiconductor switches.

15 Claims, 7 Drawing Sheets

Figure 1:
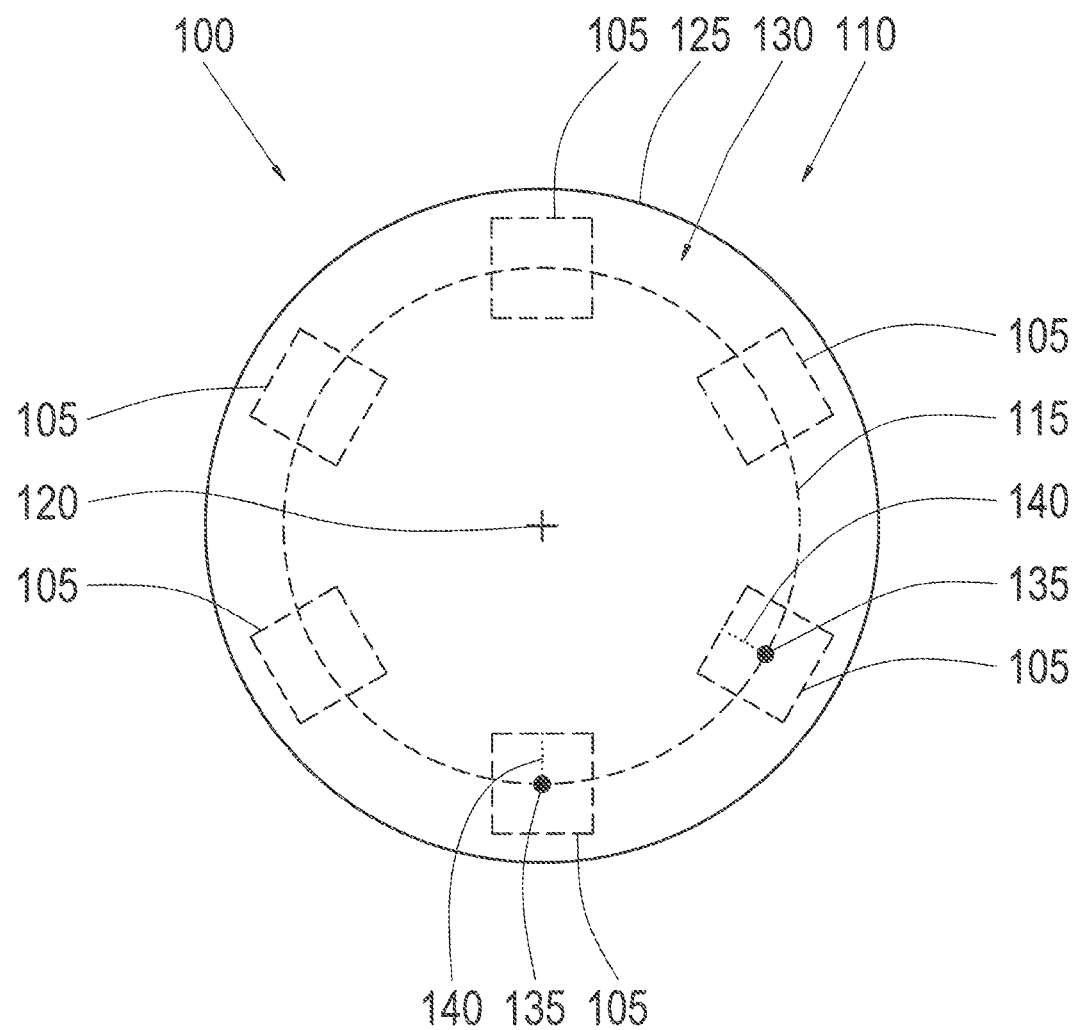

(51) Int. Cl.
*H05K 7/20* (2006.01)
*H02M 7/00* (2006.01)

(56) References Cited

U.S. PATENT DOCUMENTS

| | | | |
|---|---|---|---|
| 2011/0067945 A1* | 3/2011 | Sonoda | B62D 5/0406 |
| | | | 180/444 |
| 2013/0141871 A1 | 6/2013 | Omae et al. | |
| 2013/0249356 A1* | 9/2013 | Nakano | H02K 5/24 |
| | | | 310/68 D |
| 2014/0340013 A1* | 11/2014 | Li | H02K 3/28 |
| | | | 318/400.26 |
| 2016/0134178 A1* | 5/2016 | Acinas Lope | B62D 5/0406 |
| | | | 310/64 |
| 2016/0149525 A1* | 5/2016 | Owen | H02M 7/003 |
| | | | 318/400.26 |

OTHER PUBLICATIONS

Written Opinion of the International Search Authority dated Feb. 19, 2015 in International Application No. PCT/EP2015/053467, 6 pages, German Language.
English Language Translation of International Search Report dated May 27, 2015 in International Application No. PCT/EP2015/053467, 3 pages.
Office Action of Priority Application DE102014205956.9 dated Aug. 8, 2014, 9 pages, German Language including English Translation of p. 7.

* cited by examiner

DRIVER ASSEMBLY

This application is a filing under 35 U.S.C. § 371 of International Patent Application PCT/EP2015/053467, filed Feb. 19, 2015, and claims the priority of DE 10 2014 205 956.9, filed Mar. 31, 2014. These applications are incorporated by reference herein in their entirety.

The disclosure concerns a driver assembly. The disclosure particularly concerns the dissipation of heat from elements of the driver assembly.

A control unit, such as on board of a motor vehicle, for example, is configured to provide current or voltage to control a connected consumer. A three-phase alternating voltage can be provided, for example, to control the direction of rotation and rotation speed of a connected electric motor.

A driver assembly comprises several semiconductor switches to provide the required current. The semiconductor switches usually do not work without loss, so that heat must be dissipated from them. To guide supply lines to the semiconductor switches as shortly and directly as possible, and to be able to cool it by means of a joint heat sink, the semiconductor switches are usually arranged in a row or are arranged matrix-shaped. Semiconductor switches that are situated in outside areas are thereby cooled better than semiconductor switches situated further inside. Through the different temperatures, the semiconductor switches may vary in their electrical resistance, so that the overall electrical capacity of the driver assembly may be reduced. The semiconductor switches can also age at different degrees of intensity, respectively at different speeds, so that their probabilities of default vary. The probability of default of the entire driver assembly may thus be increased. Supply lines to the semiconductor switches can also vary in length, whereby an electromagnetic compatibility (EMC), an impedance, or a voltage drop in the area of the supply line can be influenced negatively.

It is the task of the present disclosure to specify an improved driver assembly. The disclosure solves this task by means of a driver assembly with the features of the independent claim. Sub claims describe preferred embodiments.

A driver assembly according to the disclosure comprises several semiconductor switches that are arranged in a plane, so that the distances between adjacent semiconductor switches are usually of the same size in the plane, and so that each semiconductor switch has the same number of adjacent semiconductor switches.

The semiconductor switches may comprise bipolar transistors, field-effect transistors, MOSFETs, thyristors, switching diodes, or IGBTs, for example. The semiconductor switches are preferably discrete components that can be positioned in the plane individually. If each semiconductor switch delivers the same thermal output, equal temperatures may be set on the semiconductor switches. A thermal energy input at the location of a semiconductor switch, based on adjacent semiconductor switches, is equally big for all semiconductor switches due to their arrangement. The same aging, the same load capacities, or the same probabilities of default may apply for the semiconductor switches through the same temperatures. The driver assembly can thereby be more reliable or more resilient.

In a preferred embodiment, the semiconductor switches are evenly distributed on a circle. In other words, the arrangement of the semiconductor switches in the level can be rotationally symmetric by a predetermined location. It is thereby furthermore preferred that it is an n-fold rotational symmetry, where n is the number of the semiconductor switches used.

In one embodiment, distances between the semiconductor switches are defined as the shortest distances from points of their outlines in the plane. In another embodiment, a point can be marked on each semiconductor switch, whereby the distance between two semiconductor switches is defined as the distance between the assigned points. For instance, the marked point can be a geometric center point or a point that is heated strongest during the operation of the semiconductor switch. The position of a semiconductor switch can be indicated by the position of the marked point.

In one embodiment, it is sufficient, if the marked points have the described relative distances, whereby rotational directions of the semiconductor switch can be freely chosen in the plane. Electrical supply lines to the semiconductor switches can thereby be advantageously guided either short or non-crossing.

The rotational directions of the conductors to each other or with regard to a reference point are important in a different embodiment. The semiconductor switches can especially be located uniformly to one another. A direction can additionally be specified on each semiconductor switch, which preferably runs through the marked point mentioned above. For example, the directions of the semiconductor switches can run parallel to each other, or angles that include the directions with a common point can be the same for all semiconductors. An equal heat distribution within the driver assembly can therefore especially be improved, if the semiconductor switches can be modelled sufficiently accurately as radially symmetrical heat sources.

It is furthermore preferred that at least six semiconductor switches are provided, whereby the driver assembly is covered by at least one multi-phase inverter. Such an inverter usually comprises several half bridges with two semiconductor switches each. The multi-phase inverter can especially be configured to control a multi-phase electric motor. The inverter can particularly be configured on the board of a motor vehicle, such as for a steering or brake support; an electrical rear axle steering, an electrical height adjustment (levelling by wire) and for electric drives. The inverter can furthermore be provided for two-wheeler vehicles that usually have little installation space.

At least one of the half bridges is preferably electrically coupled with another semiconductor switch as a phase separator, through which the respective phase formed by the half bridge can be separated. A safe state can thus be created in the event of a fault. It is furthermore preferred that each of the half bridges are electrically coupled with another semiconductor switch as a phase separator. The phase separator of the assigned half bridge is preferably also intended as subordinate in an electrical conductive path. Such a phase separation can especially be intended for a fail-safe strategy, such as an electrical steering or other type of support.

It is furthermore preferred that the at least one phase separator is arranged in a plane parallel to the semiconductor switches. The at least one phase separator can be arranged on a side of a semiconductor switch support element different from the semiconductor switches. The support element is preferably a board. It is furthermore preferred that the phase separators on the other side are arranged in a way prescribed for the semiconductor switches. Alternatively, the phase separators can be arranged in a plane together with the semiconductor switches in a manner prescribed. The same described benefits can thus be achieved for the phase separators.

It is further preferred that the phase separators and the semiconductor switches in different planes are usually arranged on a circle, whereby the circle assigned to the phase separator is encompassed by the circle assigned to the semiconductor switches in a top view that runs through the planes. A thermal stress of a carrier material from a carrier material comprising the semiconductor switch and the phase separator can thus be equalized. A possible temperature listing can furthermore be reduced to the semiconductor switch. A compact arrangement of the semiconductor switch and the phase separator is furthermore possible. The circles preferably furthermore have a joint central axis that runs through the planes. A more consistent thermal stress of the carrier material can thus be achieved.

A heat sink for the thermal coupling with the semiconductor switches is preferably furthermore intended, and it is furthermore preferred with the at least one phase separator, whereby the heat sink comprises several contact segments located in one plane for the installation on the semiconductor switches, and more preferably to the at least one phase separator. Through the use of one single heat sink, the semiconductor switch and more preferably the at least one phase separator can be cooled evenly, and it can result in cost benefits for material and installation.

In one embodiment, the contact segments are encompassed by a contact surface that has the shape of a circle. One of the semiconductor switches and more preferably the surface of the heat sink facing the at least one phase separator can thereby be formed in a simple and cost-saving way. In another embodiment, the contact segments are encompassed by a contact surface that has the shape of a regular polygon with as many corners as semiconductor switches and furthermore preferably phase separators lie flat against the heat sink preferably in the same plane. A cooling capacity of the heat sink can thus be improved. The fastening of the heat sink can also be facilitated through its polygon shape. The heat sink can furthermore preferably be formed through a housing of a synchronous motor or alternatively be flange-mounted to the housing. The latter is particularly advantageous for a frontal mounting of the inverter along with high tightness requirements.

The rotational arrangement of the semiconductor switch, respectively of the phase separators is furthermore particularly advantageous for a direct connection of the inverter to a front, respectively contact side of a synchronous motor. A contacting can thus be done in the shortest way by connecting the motor contacts with the carrier element or with carrier element contacts. The free center space of the semiconductor arrangement can hereby be used for this in an advantageous way. A motor shaft end with an integrated magnet can furthermore advantageously also be guided through the free space using a hole cut-out to enable a rotor position center, which is a hall sensor, for example, and which is furthermore arranged on a further carrier element that is in parallel to the carrier element, to detect a rotation angle.

In one embodiment, the semiconductor switch and furthermore preferred the at least one phase separator have surface-mounted components, whereby the semiconductor switch and more preferably the at least one phase separator are in electric contact by means of conducting paths, and where the heat sink comprises a protrusion situated outside the plane for the thermal coupling with the at least one conducting path. The conducting path can thereby be cooled additionally so that a hot spot in the area of the conductor assembly can be avoided in an improved manner. The semiconductor switch and more preferably the at least one phase separator can be arranged in any desired, surface-mounted housing, whereby DirectFETs are used in a particularly preferred embodiment.

According to a preferred embodiment, a short-circuit switch is assigned to every half bridge, which is electrically coupled with a conducting path electrically connecting the two semiconductor switches of the half bridge with each other, whereby the short-circuit switches are electronically connected among each other. Using the short-circuit switches, an electric motor can be slowed down for use as a generator, for example. Alternatively or additionally, a slowing down to a standstill of an electric motor can be the consequence of a safety requirement, which requires a sluggish or a blocking motor function in case of an error, which preferably corresponds to a safe condition. Such a safety requirement, respectively such a phase short-circuit can be used for active rear wheel steering in an advantageous way, for example.

The short-circuit switch is preferably a MOSFET or a directFET. Further preferred are short-circuit switches arranged in a previously described manner with regard to the semiconductor switch, respectively phase separator and which are furthermore preferably coupled with a heat sink. This arrangement and coupling is particularly recommended, when the short-circuit switches must be cooled. An arrangement of the short-circuit switches as described before that are preferably arranged in a different plane than the semiconductor switches, is not urgently required otherwise.

It is furthermore preferred that conducting paths for the electrical connection of lines from the semiconductor switches essentially have equally large surfaces. Through the specified arrangement in the plane, it is possible to design the electrical connections in a similar geometrical manner. It is particularly preferred that the conducting paths to the different semiconductor switches are essentially equally long, of equal width, and equal thickness. Electrical characteristics such as electrical resistance, impedance, or an effect on electromagnetic interference fields can thus correlate. The currents of the single phases can furthermore be adapted to each other. An EMV emission as low as possible can furthermore be achieved. If the semiconductor switches are equally loaded electrically, thermal lines can also correlate in the field of the conducting paths. These preferred embodiments of conducting paths are preferably applicable on conducting paths for the electrical connection of lines of the phase separator, respectively phase separators, and or the short-circuit switches.

In one version, the driver assembly comprises a predetermined number of semiconductor switches, whereby each semiconductor switch is assigned to at least one of the two driver assemblies described above. In other words, the semiconductor switches of the driver assembly can also be arranged in two or more groups, whereby the described arrangement specifications apply to each group. The two groups can be arranged in one plane or in different planes. In one embodiment, the planes of the groups are arranged parallel to one another.

A redundant inverter circuit can furthermore preferably be equipped with phase separators or short-circuit switches in accordance with a previously described embodiment.

Figure 2:
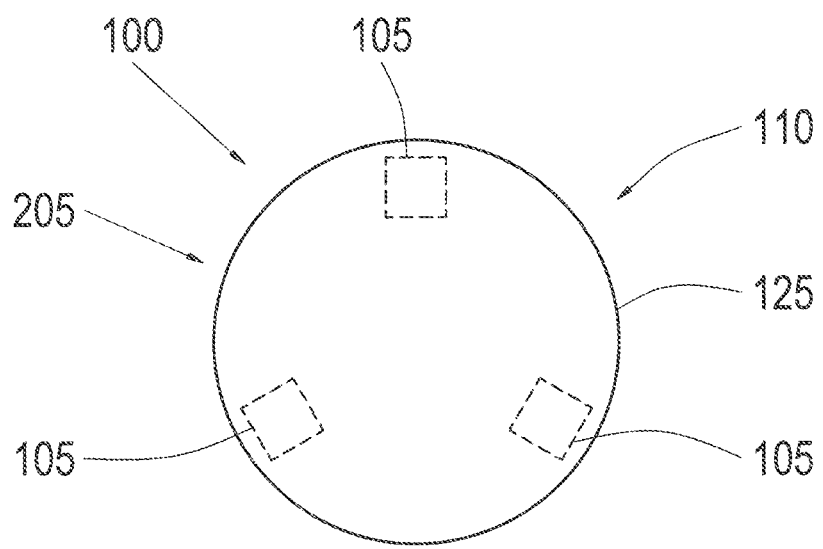
Figure 2:
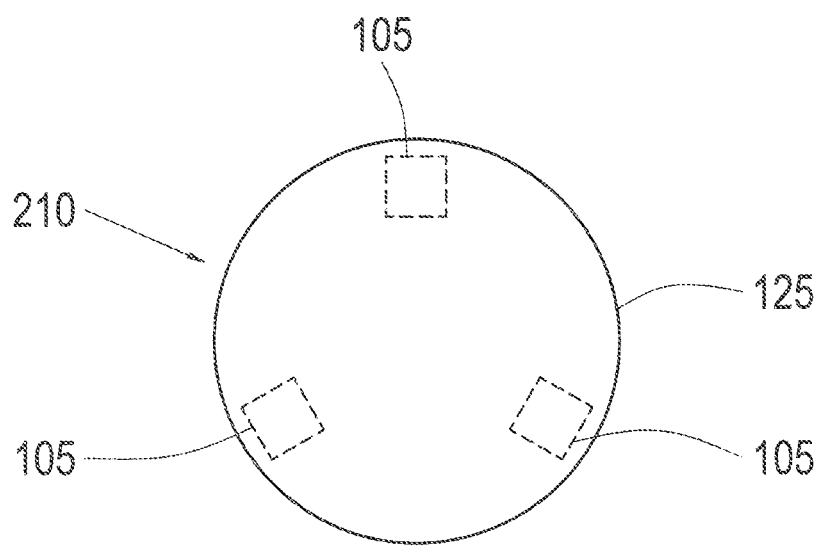
Figure 3:
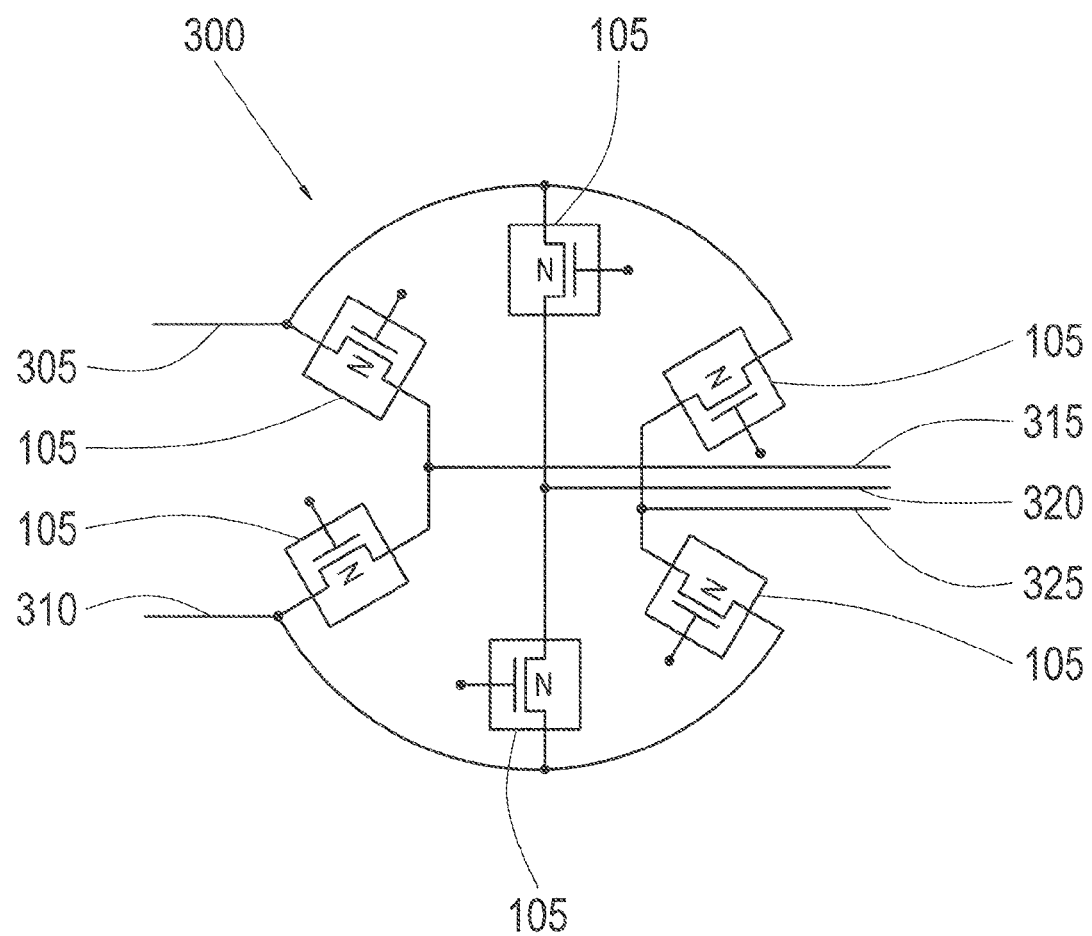
Figure 4:
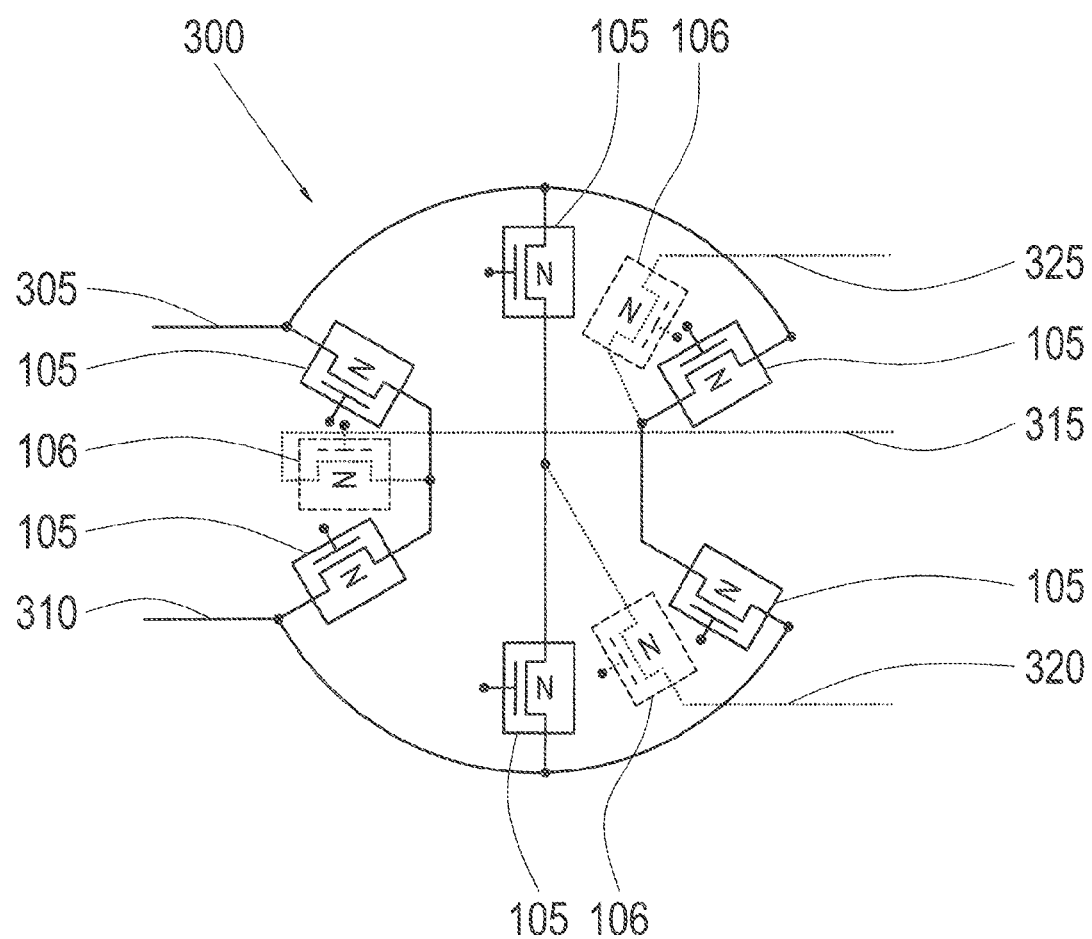
Figure 5:
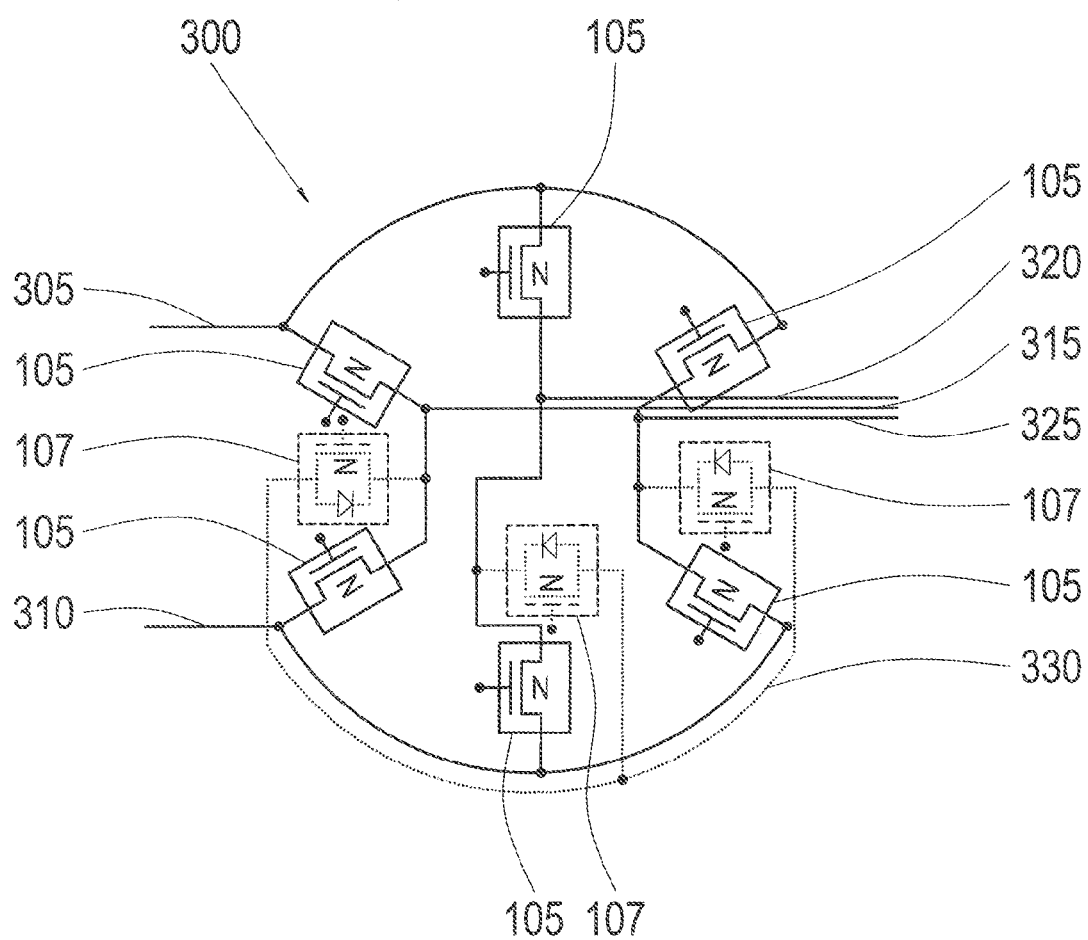
Figure 6:
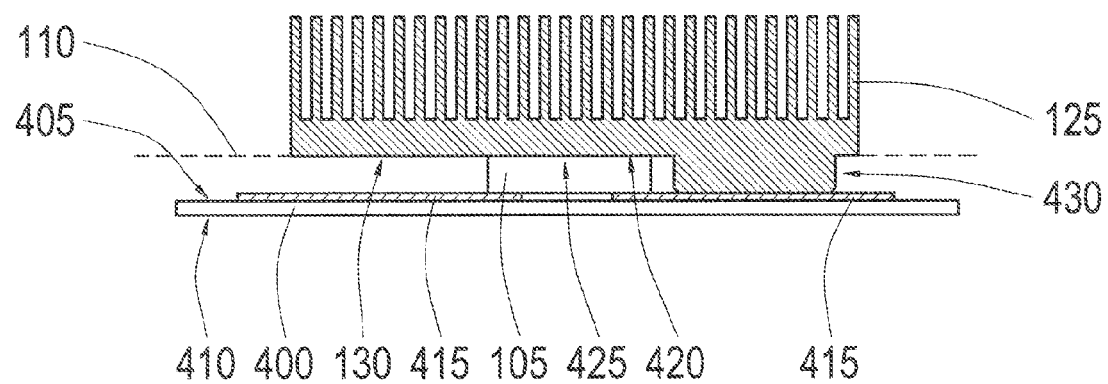

The disclosure is now described in more detail with reference to the enclosed figures, in which the following is shown:

FIG. 1 an arrangement of semiconductor switches of a driver assembly;

FIG. 2 an alternative arrangement of the semiconductor switches of FIG. 1;

FIG. 3 a circuit diagram of a three-phase inverter in the arrangement of FIG. 1;

FIG. 4 a circuit diagram of a three-phase inverter shown in the arrangement of FIG. 1 with a phase separator shown in the arrangement of FIG. 1;

FIG. 5 a circuit diagram of a three-phase inverter with a short-circuit switch shown in the arrangement of FIG. 1;

FIG. 6 a side view of an embodiment of the driver assembly of FIG. 1, and

FIG. 7 a display of temperatures on the three-phase inverter of FIG. 3.

FIG. 1 shows a schematic representation of a driver assembly 100. The driver assembly 100 comprises a number of semiconductor switches 105, whereby six semiconductor switches 105 are intended in FIG. 1 in a purely exemplary way. The semiconductor switches 105 are of the same type and are arranged two-dimensionally in a plane 110. The arrangement is thereby such that each semiconductor switch 105 has the same number of adjacent semiconductor switches 105 and that the distances between adjacent semiconductor switches 105 are the same, respectively.

In the embodiment featured, the semiconductor switches 105 are placed evenly distributed in a circle 115 around a central point 120. The semiconductor switches 105 are therefore offset from each other by 60° each on the circle. This arrangement has a 6-digit rotational symmetry relative to the central point 120.

The arrangement of the semiconductor switches 105 is chosen, so that a joint heat sink 125 can have a contact surface 130, which is rotationally symmetrical to the central point 120 and parallel to the plane 110 for the thermal coupling with the semiconductor switches 105. In the embodiment shown, the contact surface 130 of the heat sink 125 has the shape of a circular disc, the contact surface 130 may also have the shape of a regular polygon in another embodiment, whereby it is preferred that the number of the angles corresponds to the number of the adjacent semiconductor switches 105.

The arrangement of the semiconductor switches 105 is mainly chosen for thermal reasons. Small errors, respectively tolerances in the arrangement of the semiconductor switches 105 can thus be accepted in general. If a higher precision of the alignment is necessary, a position 135 can be marked on each semiconductor switch 105 that is used to measure the positions or distances between the semiconductor switches 105. In the embodiment shown, the marked positions usually correspond to a geometric center point of the surface of the semiconductor switches, and the marked positions 135 are usually located on the circle 115, whereby distances of the marked positions 135 of the semiconductor switches 115 adjacent to the circle 115 are of equal size. In a further embodiment, the distances of the semiconductor switches 105 are defined with each other in reference to the smallest distances of their outline in the plane. In the embodiment shown, rotational orientations of the semiconductor switches 105 to each other are chosen differently in plane 110.

In another embodiment, the rotational orientation of each semiconductor switch 105 is also considered in relation to the center point 120. This can be useful, for example, if outlines of the semiconductor switches 105 in the plane are elongated other than represented in FIG. 1. To determine the orientation, one direction can be predetermined on the semiconductor switch, which preferably extends from the marked position 135. To adjust the orientations of the semiconductor switches 105 to each other in reference to the center point 120, it is preferred to select angles congruently, which usually include the directions 140 with radii through the center point 120. The directions 140 in a different embodiment may also be adapted to each other differently, for instance by the directions 140 running vertically to each other in parallel or in pairs.

In the presentation of FIG. 1, each semiconductor switch 105 has exactly two adjacent semiconductor switches 105, namely one to the right and one to the left on the circle 115. Semiconductor switches 105 that are further away, between which another semiconductor 105 is located on the circle 115, are not classified as being adjacent.

In one embodiment, distances between non-adjacent semiconductor switches are at least 1.5 times as big as distances between adjacent semiconductor switches 105. With these conditions, it can be ensured that the influence of heat of a semiconductor switch 105 is negligibly small on a non-adjacent semiconductor switch 105. In the embodiment shown of six semiconductor switches 105 on the circle 115, non-adjacent semiconductor switches 105 are at least 1.7 times as far away from each other compared to adjacent semiconductor switches 105 by way of example.

FIG. 2 shows an alternative arrangement of the semiconductor switch 105 of the driver assembly 100 of FIG. 1. A first group 205 and a second group 210 are formed here, which comprise several semiconductor switches 105 of the driver assembly 100, respectively. By way of example, each group 205, 210 has three semiconductor switches 105, respectively. In each group 205, 210, the semiconductor switches 105 are arranged in accordance with the specifications explained previously with regard to the arrangement of FIG. 1. In the embodiment shown, a separate heat sink 125 is assigned to each group 205, 210; a single heat sink 125 may also be used in an alternative embodiment, if all the semiconductor switches 105 are located in the same plane 110. In yet another embodiment, the semiconductor switches 105 may also be located in parallel planes 110, whereby the heat sinks 125 usually extend in the direction that is at a distance from the other plane 110. The semiconductor switches 105 of the first group can particularly be arranged on the top side, and the semiconductor switches 105 of the second group 210 can be arranged on the bottom side of a board that the semiconductor switches 105 are attached to mechanically and electrically, whereby the heat sinks 125 extend in opposing directions away from the board.

FIG. 3 shows a circuit diagram of a three-phase inverter 300. The representation is done in hybrid, by that the semiconductor switches 105 and their connections are represented as a circuit symbol, while the arrangement of the semiconductor switches 105 must be interpreted geometrically. The embodiment shown orients itself by the example of FIG. 1. Elements of the three-phase inverter 300 that go beyond the driver assembly 100 are not represented.

By way of example, a first line 305 is connected with a high potential and a second line 310 is connected with a low potential. Usually two semiconductor switches 105 form a half bridge between the lines 305 and 310. Central tappings of the half bridges are lead out as output lines 315 to 325. They can be used, for example, to connect an electrical three-phase motor, whose torque, speed, or direction of rotation can be controlled through a corresponding controlling of the semiconductor switches 105. Such an electric motor can be used for control tasks on board of a motor vehicle, for example, such as in a steering or brake support.

Even though the connections between the semiconductor switches 105 are not represented without junctions, it can be seen that the supply lines 305, 310, and the output lines 315 to 325 can be designed in a geometrically similar way.

Especially the lengths of corresponding lines 305 to 325 can correlate. Only parts of the lines 305 to 325 that are located in a radius around the center point 120 (not shown) are thereby essentially considered, whereby the radius touches the radially outermost points of the semiconductor switches 105.

FIG. 4 and FIG. 5 usually show a circuit diagram of a three-phase inverter 300 expanded by a phase separation circuit, respectively a short-circuit switch. The representation is done equivalent to FIG. 3, which is why the section concerning FIG. 1 is referred to in reference to the electrical connection of the semiconductor switches 105.

FIG. 4, in particular, shows the three-phase inverter 300 with a phase separation circuit comprising three more semiconductor switches 106 formed as phase separators, which are assigned to a half bridge consisting of two semiconductor switches 105 each, and which are electrically coupled with it. The phase separators 106 are arranged in a plane that is parallel to the plane comprising the arrangement of the semiconductor switches 105. The phase separators 106 are preferably arranged on a side of a board different from the semiconductor switches 105. The respective phase separator 106 is electrically coupled with the respective half bridge through the first 315, resp. second 320, resp. third 325 output line assigned to the respective half bridge. The phase separator 106 is therefore intended to be subordinate to the respective half bridge. The arrangement of the phase separators 106 is done in a manner stipulated in accordance with the arrangement of the semiconductor switches 105, whereby the phase separators 106 in a top view of the planes are arranged on a circle identical to the semiconductor switches 105, whereby a phase separator 106 is arranged between two adjacent semiconductor switches 105. According to an alternative embodiment, the phase separators 106 are arranged on a circle, which is located inside of the circle showing the semiconductor switches 15 in a top view of the arrangement planes. This makes it possible to achieve a more compact arrangement of the semiconductor switches 105 and the phase separators 106. The board showing the semiconductor switches 105 and the phase separators 106 can furthermore be equalized more with regard to a thermal stress.

FIG. 5 shows, in particular, the three-phase inverter 300 with a short-circuit switch comprising three more semiconductor switches 107 formed as short-circuit switches, which are assigned to a half bridge consisting of two semiconductor switches 105 each, and which are coupled electrically with it as well as with each other. The short-circuit switches 107 are arranged in a plane that is parallel to the plane comprising the arrangement of the semiconductor switches 105. The phase separators 107 are preferably arranged on a side of a board different from the semiconductor switches 105. The respective short-circuit switch 107 is electrically coupled with the line connecting the two semiconductor switches 105 forming the one half bridge as well as with the other short-circuit switches 107 through a joint connecting line. The short-circuit switch 107 is therefore intended subordinate to the semiconductor switches 105 shaping the half bridge. The respective short circuit 107 is arranged closely to its connection point for the connection to the respective line, to use the shortest possible lines. According to another preferred embodiment not shown, the arrangement of the short-circuit switches 107 can take place in a respective manner stipulated in one of the arrangements of the phase separators 106, if a cooling of the short-circuit switches 107 were to be required, for example.

FIG. 6 shows a side view of an embodiment of the driver assembly 100 of FIG. 1. A board 400 has a top 405 and a bottom 410. One or more conducting paths 415 run along the top 405, which are electrically connected with the semiconductor switch 105. The semiconductor switch 105 is thereby surface-mounted and is also located on the top 405 of the board 400.

A contact section 420 of the heat sink 125 is located on a contact surface facing away from the board 400 of the semiconductor switch 105 to produce a thermal coupling. For an improved heat conduction, for the electrical insulation or for height compensation, a thermally conductive pad, a heat-conducting paste, a mica wafer, or another element that preferably has a good heat transfer with the worst possible electrical conductivity may be intended between the contact surface 425 and the contact section 420.

The heat sink 125 can have a protrusion 430 that is located outside of the plane 110 that comprises the contact section 420. The protrusion 430 extends in the direction of the board 400 and is thermally coupled with the conducting path 415. A conducting path 415 is thereby preferably thermally connected, which comprises a supply line or an output line 305 to 325, a control line may however also be comprised. An element for height compensation, for the improvement of the heat conduction, or for the electrical insulation may also be intended here between the protrusion 430 and the conducting path.

Figure 7A:
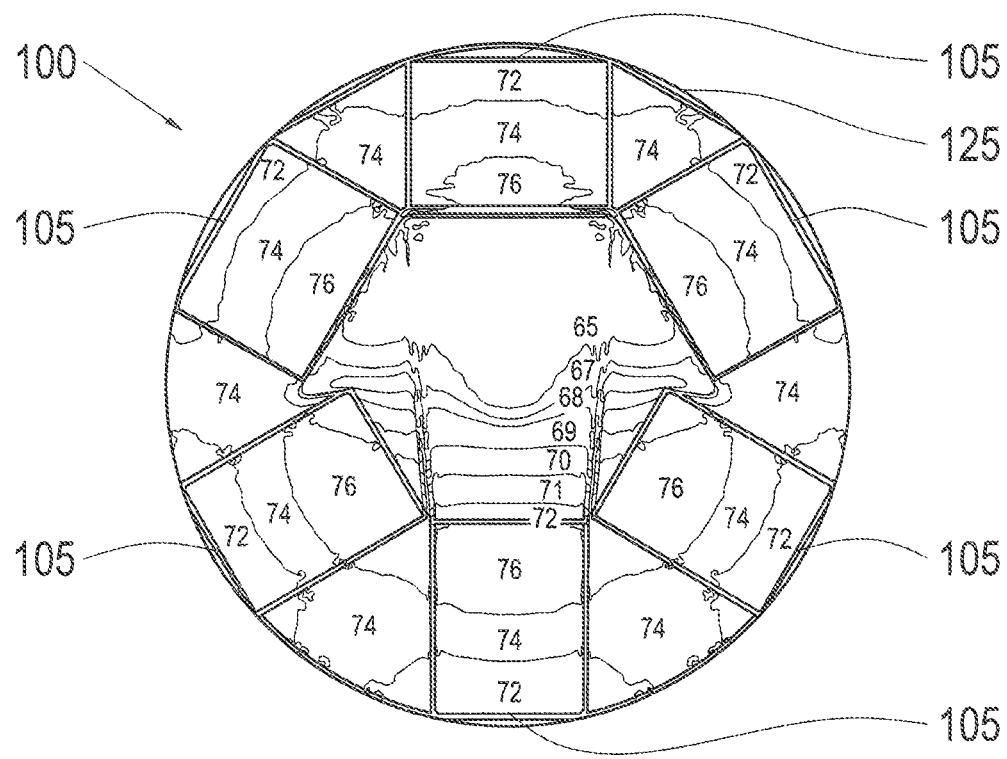

FIG. 7A shows a representation of temperatures in the upper area on a circular arrangement of six semiconductor switches 105 that are used as a driver assembly 100 for the three-phase inverter 300 of FIG. 3 in the present example. A prior art rectangular arrangement of semiconductor switches 105 is represented in FIG. 7B.

In the three-phase inverter 300, the semiconductor switches 105 are essentially switched on and off with the same frequencies and duty cycles, so that each semiconductor switch 105 practically converts the same electrical output into heat output. What is shown, is a top view on the plane 110. The semiconductor switches 105 are in contact with a heat sink 125 on their top sides. Geometrical sections, whose temperatures fall into a joint area are represented coherently, whereby exemplary averages of the temperature ranges are entered in ° C. numerically.

It can be seen in FIG. 7A that the surface of each semiconductor switch 105 only comprises few temperature ranges in the round arrangement represented above, and that the surfaces of the semiconductor switches 105 essentially have the same temperature ranges. The temperature load of each individual semiconductor switch 105 and the temperature loads of all the semiconductor switches 105 are therefore highly homogenous. Aging and probabilities of default of the semiconductor switches 105 of the driver assembly 100 can therefore be essentially the same throughout their operating periods. The semiconductor switches 105 can therefore be dimensioned to a predetermined electrical load in an improved manner. This can be advantageous, particularly in a security-critical application like with the control of a servomotor, such as for a steering or brake control on board of a motor vehicle, for example.

Figure 7B:
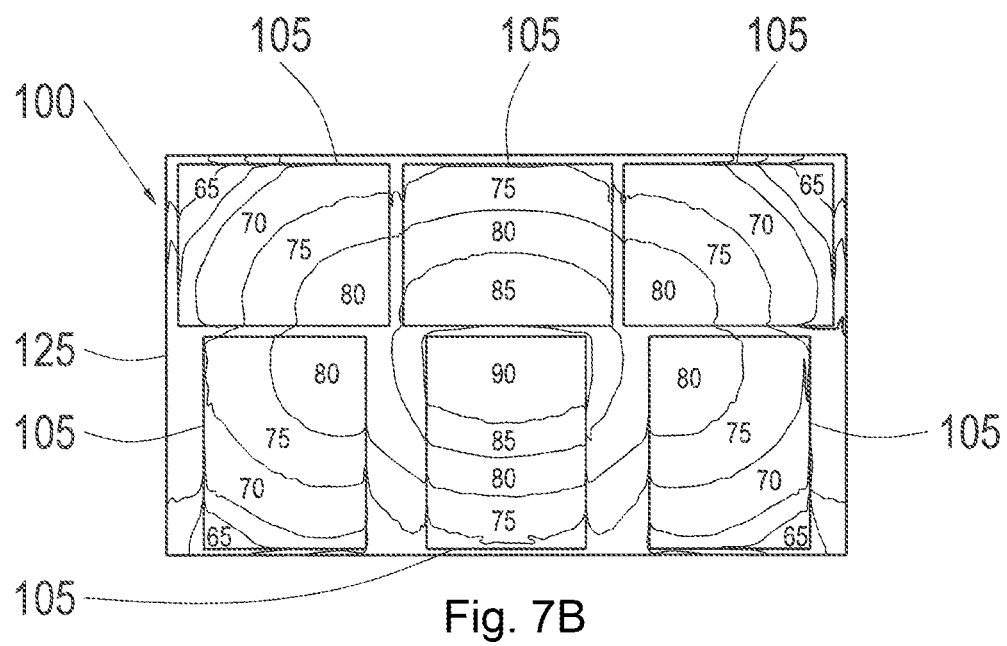

On the rectangular arrangement represented in FIG. 7B, in which adjacent semiconductor switches have unequal distances to each other, the temperatures are higher overall on the surface of the semiconductor switches 105. The surfaces of the semiconductor switches 105 usually also comprise more temperature ranges, which are additionally positioned further apart. The semiconductor switches 105 have different significantly highest and lowest temperatures among themselves. It must be assumed that the semiconductor switch 105 with the highest temperature load ages the fastest and has the highest probability of default. The aging and the probability of default of each individual semiconductor switch 105 is however difficult to determine due to the strong temperature gradients on the surfaces of the semiconductor switches 105, so that the capacity, respectively resistance of the arrangement shown can be subjected to a great uncertainty. Less power can furthermore be switched through this inverter arrangement permanently, as the achieving of the limit temperature of an individual semiconductor switch 105 defines the switch-off limit or degradation limit of the entire arrangement.

REFERENCE SYMBOLS

100 Driver assembly
105 Semiconductor switch
106 Phase separator
107 Short-circuit switch
110 Plane
115 Circle
120 Center point
125 Heat sink
130 Contact surface
135 Position
140 Direction
205 First group
210 Second group
300 Three-phase inverter
305 First supply line (high potential)
310 Second supply line (low potential)
315 First output line
320 Second output line
325 Third output line
330 Connecting line
400 Board
405 Top
410 Bottom
415 Conducting path
420 Contact section
425 Contact surface
430 Protrusion

The invention claimed is:

1. A driver assembly coupled to a three-phase inverter, the driver assembly comprising:
    a first set of six of semiconductor switches, wherein the first set of six semiconductor switches are arranged in a plane so that distances between adjacent semiconductor switches are equally large, respectively, and so that each semiconductor switch has the same number of adjacent semiconductor switches, wherein the first set of six semiconductor switches form three half bridges each assigned to one of the three phases, wherein each half bridge is comprised of two of the first set of six semiconductor switches; and
    a second set of three additional semiconductor switches, wherein each of the second set of three additional semiconductor switches are electrically coupled to every other second set of three additional semiconductor switches using a joint connecting line, wherein each half bridge is electrically coupled with one of the second set of three additional semiconductor switches, wherein each of the second set of three additional semiconductor switches are arranged in a different plane than the two semiconductor switches forming each half bridge.

2. The driver assembly according to claim 1, wherein the first set of six semiconductor switches are evenly distributed on a circle.

3. The driver assembly according to claim 1, wherein distances between non-adjacent semiconductor switches of the first set of six semiconductor switches are at least 1.5 times as large as distances between adjacent semiconductor switches of the first set of six semiconductor switches.

4. The driver assembly according to claim 1, wherein the first set of six semiconductor switches are evenly aligned with one another.

5. The driver assembly according to claim 1, further comprising a heat sink for the thermal coupling with the first set of six semiconductor switches, wherein the heat sink comprises several contact sections located in one respective plane for installation on the first set of six semiconductor switches.

6. The driver assembly according to claim 5, wherein the contact sections are encompassed by a contact surface that has the shape of a circle.

7. The driver assembly according to claim 6, further comprising an insulator located between the contact section and the contact surface, wherein the insulator is thermally conductive and electrically insulating.

8. The driver assembly according to claim 7, wherein the insulator is a thermally conductive pad, a heat-conducting paste, or a mica wafer.

9. The driver assembly according to claim 5, wherein the contact sections are encompassed by a contact surface which has the shape of a regular polygon with as many angles as are located on semiconductor switches adjacent to the heat sink.

10. The driver assembly according to claim 5, wherein the first set of six semiconductor switches comprise surface-mounted components, wherein the first set of six semiconductor switches are in electrical contact through conducting paths and the heat sink comprises a protrusion located outside of the plane for the thermal coupling with at least one conducting path.

11. The driver assembly according to claim 10, wherein the conducting paths for the electrical connection of lines of the first set of six semiconductor switches have equally sized surfaces.

12. The driver assembly according to claim 1, wherein each of the second set of three additional semiconductor switches is a short-circuit switch electrically connected to each half-bridge.

13. A driver assembly coupled to a three-phase inverter, the driver assembly comprising:
    a first set of six of semiconductor switches, wherein the first set of six semiconductor switches are arranged so that each semiconductor switch has the same number of adjacent semiconductor switches, wherein the first set of six semiconductor switches form three half bridges each assigned to one of the three phases, wherein each half bridge is comprised of two of the first set of six semiconductor switches; and
    a second set of three additional semiconductor switches, wherein each of the second set of three additional semiconductor switches are electrically coupled to every other second set of three additional semiconductor switches using a joint connecting line, wherein each half bridge is electrically coupled with one of the second set of three additional semiconductor switches, wherein each of the second set of three additional semiconductor switches are arranged in a different plane than the two semiconductor switches forming each half bridge,
wherein the first set of six semiconductor switches comprise a first group of semiconductor switches and a second group of semiconductor switches, wherein the first group of semiconductor switches and the second group of semiconductor switches are mechanically and electrically attached to a board, wherein the first group of semiconductor switches are arranged on a first side of the board and the second group of semiconductor switches are arranged on a second side of the board, wherein the first side is opposite the second side.

14. The driver assembly according to claim 13, further comprising a plurality of heat sinks coupled to the first group of semiconductor switches and the second group of semiconductor switches, wherein the plurality of heat sinks extend in opposing directions away from the board.

15. The driver assembly according to claim 13, further comprising a heat sink coupled to the first group of semiconductor switches and the second group of semiconductor switches.

\* \* \* \* \*